United States Patent

Cook, Jr.

[15] 3,676,922

[45] July 18, 1972

[54] METHOD OF FABRICATING A SEMICONDUCTOR DEVICE

[72] Inventor: Charles R. Cook, Jr., North Palm Beach, Fla.

[73] Assignee: International Telephone and Telegraph Corporation, Nutley, N.J.

[22] Filed: Feb. 13, 1970

[21] Appl. No.: 11,225

[52] U.S. Cl. ....................................29/577, 29/628, 29/588, 29/471.1

[51] Int. Cl. ........................................B01j 17/00, H01l 1/16

[58] Field of Search .................29/577, 627, 576 S, 588, 628, 29/471.1; 174/DIG. 3, DIG. 6

[56] References Cited

UNITED STATES PATENTS

| | | | |
|---|---|---|---|
| 3,374,537 | 3/1968 | Doelp | 29/627 |
| 3,341,649 | 9/1967 | James | 29/577 UX |

*Primary Examiner*—John F. Campbell
*Assistant Examiner*—W. Tupman
*Attorney*—C. Cornell Remsen, Jr., Walter J. Baum, Paul W. Hemminger, Percy P. Lantzy, Philip M. Bolton, Isidore Togut and Charles L. Johnson, Jr.

[57] ABSTRACT

This is a method of forming interconnection leads between connecting pads on an integrated circuit chip and corresponding external conductors for the device. This is accomplished by placing a conductive metal sheet over the chip and surrounding external lead portions in such a manner as to visibly locate each connecting pad and external lead; then each portion of the overlying conductive sheet is bounded to each underlying connecting pad and external lead; the desired interconnection pattern between each of the connecting pads and each of the external leads is formed on the conductive sheet; and portions of the conductive sheet are then removed thus leaving the desired interconnection leads.

6 Claims, 5 Drawing Figures

INVENTOR
CHARLES R. COOK, JR.
BY Stephen A. Young
ATTORNEY

METHOD OF FABRICATING A SEMICONDUCTOR DEVICE

BACKGROUND OF THE INVENTION

This invention relates to a method of fabricating semiconductor devices, more specifically, fabricating interconnection leads between connecting pads on an integrated circuit chip and surrounding external leads of the device.

It has been found that a major expense in the fabricating of integrated circuits is incurred during the final packaging steps. This increase in cost and time becomes a problem specifically during the electrical interconnection of the conducting pads on the integrated circuit chip to the appropriate external lead conductors. The most general way in which this is being accomplished is by aligning tiny wires between each appropriate conducting pad and external lead and then thermocompression or ultrasonically bonding each end of the wire to the conducting pad and external lead. This step may require two aligning procedures and possibly manual operation.

SUMMARY OF THE INVENTION

It is an object of this invention to provide an improved method of fabricating semiconductive devices.

It is a further object of this invention to provide for an improved method of electrically interconnecting connecting pads on an integrated circuit chip to appropriate external leads of the device.

According to a broad aspect of this invention, there is provided a method of fabricating a semiconductor device comprising the steps of placing a semiconductor die on the surface of a substrate, said die having a plurality of connecting pads adjacent the periphery of said die, placing a plurality of external lead conductors on said substrate, each of said external leads located near a selected one of said connecting pads, applying a conductive sheet over said die and said substrate in such a manner as to visibly locate each connecting pad and external lead, bonding each portion of said overlying conductive sheet to each underlying connecting pad and external lead, removing portions of said conducting sheet necessary to establish an interconnection pattern between each of said connecting pads and each of said external leads, and encapsulating said device.

DESCRIPTION OF THE PREFERRED EMBODIMENTS

Although this invention can be applied to a variety of electrical components, the fabrication technique described herein shall refer to the assembly of an integrated circuit device by way of example only.

Figure 1:
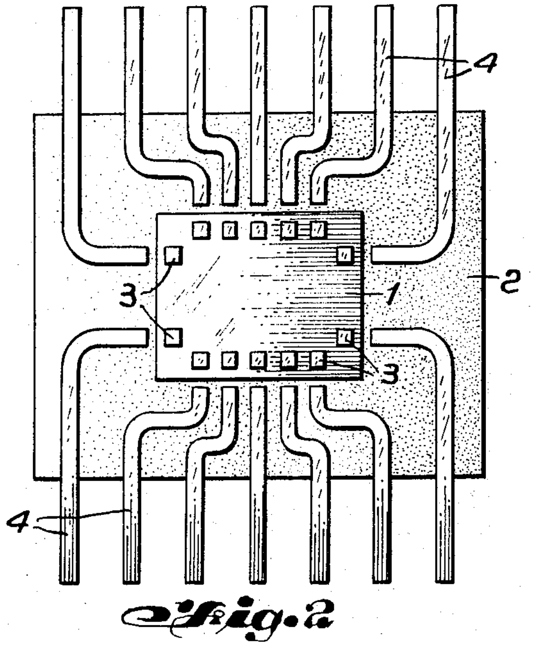
FIG. 1 shows a semiconductor die and the corresponding external lead conductors formed on a substrate.

As shown in FIG. 1, a semiconductor chip or die 1 having dimensions of about 3 to 15 mils in thickness and 50 mils by 50 mils, is placed on a substrate 2. This substrate can have a thickness of approximately 20–25 mils and be comprised of glass although other materials, such as plastics or ceramics, may be suitable. Chip 1 can have a plurality of connecting pads 3 formed along the periphery of one surface of said chip. By way of example, the die 1 has 14 connecting pads which will be interconnected with fourteen respective external conductive leads 4. Die 1, of course, represents any typical integrated circuit component having any number of internal structures and circuits which can be internally connected to connecting pads 3. External leads 4 are placed on substrate 2 in such a fashion as to be in close proximity with the associated connecting pads on die 1. External leads 4, initially may be part of a connecting lead frame which is mounted over the surface of substrate 2 in order to provide stability for these external leads. The external leads 4 can have a thickness ranging from 2 to 10 mils, while the connecting pads 3 can extend a distance of about 1 mil from the surface of die 3.

Figure 2:
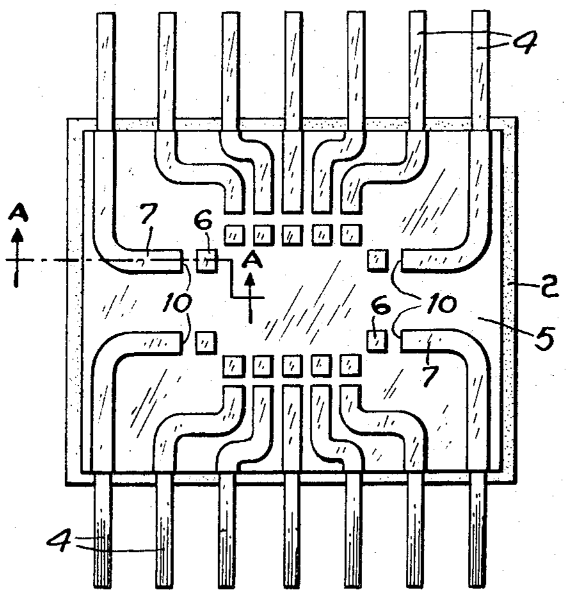
FIG. 2 shows the conductive sheet placed over the die and external leads in such a way as to locate each connecting pad and corresponding external lead.
Figure 3:
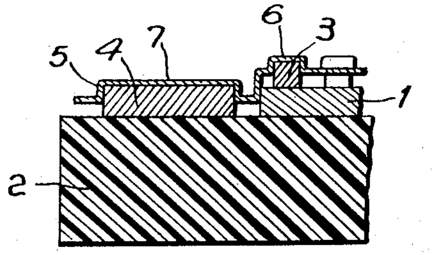
FIG. 3 is a section view of FIG. 2 taken along line A—A'.

In the next step in the process, a flexible metal foil 5 is placed over the surface of substrate 2 so as to cover portions of external leads 4 and connecting pads 3. This foil may be of aluminum or any other suitable metal, such as gold, silver or tin, and have a thickness ranging from approximately 0.5 to 10 mils. As the foil is moved downward toward substrate 2, the underlying portion of external lead 4 and connecting pads 3 actually can be visibly located from the top side of foil 5. The external leads are visibly located by the raised portion 7 of the foil 5 as shown both in FIGS. 2 and 3, while the connecting pads are visibly located by the raised portions 6 of the foil 5 also shown in FIGS. 2 and 3.

Now utilizing any well known bonding technique, such as thermocompression or ultrasonic bonding, that portion of the foil 6 overlying the connecting pads is bonded to the underlying connecting pads 3. Likewise, using the same bonding techniques, the area 10 of raised portion 7 of the foil overlying external lead 4 which is nearest each adjacent connecting pad, is also bonded to the underlying portion of the external lead 4.

Figure 4:
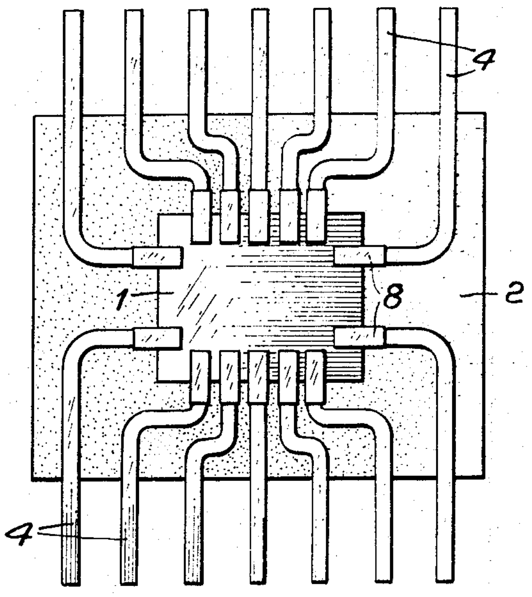
FIG. 4 shows the external leads being interconnected to the corresponding conducting pads as per said invention.

It is now necessary to establish the interconnection pattern between each external lead and each connecting pad by removing portions of the foil 5. This is accomplished by establishing the necessary interconnection pattern over the foil, this pattern would be resistant to the etchant which would be used to dissolve exposed foil portions. In an example of establishing this pattern over foil 5, a KTFR (Kodak thin film resist) is spun or sprayed over the surface of foil 5. This is a negative photoresist, i.e., a photoresist which undergoes polymerization in the areas exposed to ultraviolet light; the polymerized areas are resistant to a particular developer solution while the unexposed areas are soluble therein and the net result being that those areas which have not been irradiated are removed during the developing process. The photoresist layer is exposed to ultraviolet light through a suitable master mask so as to polymerize those portions of the photoresist in accordance with the desired interconnection pattern. After exposure, the non-polymerized portions of the photoresist layer are removed by spraying this layer with a solvent, such as Stoddard Solvent and then rinsing in a solution, such as N-butyl acetate so as to expose those portions of the surface of foil 5 to be removed. The exposed portions of foil 5 are now removed by applying an etchant to this surface by spray etching from one side only. The etchant used can be any suitable etchant which will remove aluminum, such as phosphoric acid. The spray etching apparatus is generally commercially available equipment supplied by K & S (Kulicke & Soffa Manufacturing Company). Next, the overlying remaining photoresist layer is removed to expose the remaining underlying foil which establishes the desired interconnection leads 8 between each external lead 4 and connecting pad 3, as shown in FIG. 4. This overlying polymerized photoresist can be removed by applying a series of solutions thereto: (1) a product designated as J-100 by Indust-Ri-Chem Laboratory, Inc.; (2) Xylene; and (3) Trichloroethylene; followed by spraying with isopropyl alcohol and subsequent drying of the interconnection leads 8.

Figure 5:
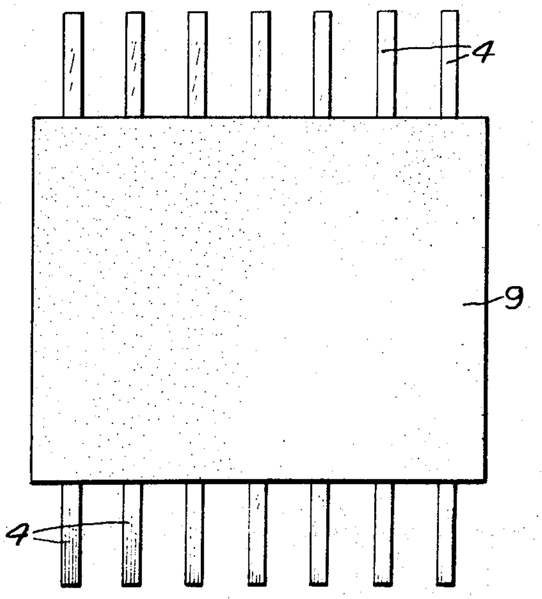
FIG. 5 is a top view of the final device package.

A glass cover 9 which matches the glass substrate 2 can be placed over the die and in contact with the outer periphery of portions of substrate 2. The upper and lower halves of the glass covers are then fused together and sealed upon the application of selected temperature and pressure conditions according to well known techniques for encapsulating components, or as described in U.S. Pat. No. 3,405,224. The metal frame, which may be used to hold together individual external leads 4, can then be severed from the conductors so that each conductor projects outwardly from the final package, as shown in FIG. 5.

While the principles of the invention have been described above in connection with specific embodiments, it is to be clearly understood that this description is made only by way of example and not as a limitation on the scope of the invention.

I claim:

1. A method of fabricating a semiconductor device comprising the steps of:
placing a semiconductor die on the surface of a substrate, said die having a plurality of connecting pads adjacent the periphery of said die;
placing a plurality of external lead conductors on said substrate, each of said external leads located near a selected one of said connecting pads;
applying a conductive sheet over said die and said substrate in such a manner as to visibly locate each connecting pad and external lead;
bonding each portion of said overlying conductive sheet to each underlying connecting pad and external lead;
removing portions of said conductive sheet necessary to establish an interconnection pattern between each of said connecting pads and each of said external leads; and encapsulating said device.

2. A method of fabricating a semiconductor device according to claim 1 wherein said conductive sheet is comprised of aluminum having a thickness ranging from 0.5 to 10 mils.

3. A method of fabricating a semiconductor device according to claim 1 wherein said substrate is comprised of glass.

4. A method of fabricating a semiconductor device according to claim 1 wherein said interconnection pattern is established by the further steps of:
applying a layer of photoresist over said conductive sheet;
placing a master mask adjacent the surface of said conductive sheet, said mask exposing said conductive sheet in accordance with said interconnection pattern;
exposing said conductive sheet to ultraviolet light in accordance with said interconnection pattern; and
removing that portion of said photoresist layer not exposed to said ultraviolet light.

5. A method of fabricating a semiconductor device according to claim 4 wherein said that portion of said conductive sheet is removed by spray etching said sheet with an etchant solution.

6. A method of fabricating a semiconductor device according to claim 1 wherein said plurality of external lead conductors are attached to a metal frame, and said metal frame is severed from said external lead conductors subsequently to said bonding step.

* * * * *